(12) United States Patent
Kim et al.

(10) Patent No.: US 12,101,570 B2
(45) Date of Patent: Sep. 24, 2024

(54) UNIT PIXEL INCLUDING ONE OR MORE CAPACITORS AND AN IMAGE SENSOR INCLUDING THE SAME

(71) Applicant: SAMSUNG ELECTRONICS CO., LTD., Suwon-si (KR)

(72) Inventors: Seok San Kim, Suwon-si (KR); Min Woong Seo, Hwaseong-si (KR); Ji-Youn Song, Seoul (KR); Hyun Yong Jung, Seoul (KR); Myung Lae Chu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 228 days.

(21) Appl. No.: 18/049,315

(22) Filed: Oct. 25, 2022

(65) Prior Publication Data
US 2023/0136165 A1 May 4, 2023

(30) Foreign Application Priority Data
Oct. 28, 2021 (KR) .................. 10-2021-0145752

(51) Int. Cl.
*H04N 25/65* (2023.01)
*H04N 25/75* (2023.01)
*H04N 25/771* (2023.01)
(52) U.S. Cl.
CPC ............. *H04N 25/65* (2023.01); *H04N 25/75* (2023.01); *H04N 25/771* (2023.01)

(58) Field of Classification Search
CPC ...... H04N 25/65; H04N 25/75; H04N 25/771; H04N 25/59; H04N 25/76; H01L 27/14603; H01L 27/14641
See application file for complete search history.

(56) References Cited

U.S. PATENT DOCUMENTS

| 8,089,035 | B2 | 1/2012 | Lahav et al. |
| 8,169,010 | B2 | 5/2012 | Kim et al. |
| 8,466,998 | B2 | 6/2013 | Suzuki |
| 9,034,682 | B2 | 5/2015 | Shim et al. |
| 10,116,889 | B2 | 10/2018 | Chen et al. |
| 10,652,479 | B2 | 5/2020 | Bitan et al. |
| 10,812,742 | B2 | 10/2020 | Chen et al. |
| 11,323,644 | B1 * | 5/2022 | Innocent ............... H04N 25/59 |

(Continued)

*Primary Examiner* — Christopher K Peterson
(74) *Attorney, Agent, or Firm* — F. CHAU & ASSOCIATES, LLC

(57) ABSTRACT

A unit pixel includes first and second photoelectric conversion units, a first transfer transistor disposed between the first photoelectric conversion unit and a first node, a first capacitor connected to the first node through a first switch transistor, and a second transfer transistor disposed between the second photoelectric conversion unit and the first node. A signal including a first voltage level is applied to the first transfer transistor and the second transfer transistor during a first time interval, a signal including a second voltage level is applied to the first transfer transistor, the second transfer transistor, and the first switch transistor during a second time interval, a signal including a third voltage level is applied to the first transfer transistor during a third time interval, and the signal including the first voltage level is applied to the second transfer transistor and the first switch transistor during a fourth time interval.

20 Claims, 14 Drawing Sheets

(56) References Cited

U.S. PATENT DOCUMENTS

| | | | |
|---|---|---|---|
| 2008/0258045 A1* | 10/2008 | Oike | H04N 25/671 |
| | | | 348/E3.018 |
| 2019/0355782 A1 | 11/2019 | Do et al. | |
| 2020/0137325 A1* | 4/2020 | Mori | H04N 25/60 |
| 2020/0286945 A1* | 9/2020 | Palaniappan | H04N 23/745 |
| 2022/0102403 A1* | 3/2022 | Ma | H04N 25/46 |
| 2023/0300495 A1* | 9/2023 | Ono | H04N 25/627 |
| | | | 348/294 |

* cited by examiner

UNIT PIXEL INCLUDING ONE OR MORE CAPACITORS AND AN IMAGE SENSOR INCLUDING THE SAME

CROSS-REFERENCE TO RELATED APPLICATIONS

This application claims priority under 35 U.S.C. § 119 to Korean Patent Application No. 10-2021-0145752, filed on Oct. 28, 2021, in the Korean Intellectual Property Office (KIPO), the disclosure of which is incorporated by reference herein in its entirety.

TECHNICAL FIELD

The inventive concept relates generally to a unit pixel and an image sensor, and more particularly to a unit pixel including one or more capacitors and an image sensor including the same.

DISCUSSION OF RELATED ART

An image sensor is a semiconductor image sensing device including unit pixels that convert optical information into an electric signal. Examples of an image sensor include a charged coupled device (CCD) image sensor and a complementary metal-oxide semiconductor (CMOS) image sensor (a CIS). An example CIS includes a plurality of unit pixels arranged in two-dimensions, where each pixel includes, for example, a photodiode. The photodiode may serve to convert incident light into electrical signals.

Unit pixels and image sensors including unit pixels can be used in various applications that demand high image quality, such as digital cameras, video cameras, smart phones, game consoles, security cameras, medical micro cameras, robots, vehicles, etc. There is therefore need in the art for unit pixels and image sensors including unit pixels that provide increased image quality.

SUMMARY

Aspects of the present disclosure provide a unit pixel having increased image quality. For example, according to some aspects, by storing electric charges accumulated in a small photodiode in on or more capacitors, the unit pixel outputs a signal with a wide dynamic range and a low amount of noise. Furthermore, according to some aspects, as an electric charge accumulated in a large photodiode is partially reset, it is possible to mitigate signal interference that may be caused by an overflow of an electric charge accumulated in the large photodiode to electric charges accumulated in a small photodiode and subsequently stored by one or more capacitors.

Aspects of the present disclosure provide an image sensor having increased image quality. For example, in some embodiments, the image sensor includes the unit pixel having increased image quality.

According to some aspects of the present disclosure, a unit pixel is provided. The unit pixel includes a first photoelectric conversion unit converting light received by the first photoelectric conversion unit into an electric charge, a first transfer transistor disposed between the first photoelectric conversion unit and a first node, a first capacitor connected to the first node through a first switch transistor, a second photoelectric conversion unit connected to the first node, and a second transfer transistor disposed between the second photoelectric conversion unit and the first node. A signal including a first voltage level is applied to the first transfer transistor and the second transfer transistor during a first time interval, a signal including a second voltage level is applied to the first transfer transistor, the second transfer transistor, and the first switch transistor during a second time interval subsequent to the first time interval, a signal including a third voltage level different from the first voltage level and the second voltage level is applied to the first transfer transistor during a third time interval subsequent to the second time interval, and the signal including the first voltage level is applied to the second transfer transistor and the first switch transistor during a fourth time interval subsequent to the third time interval.

According to some aspects of the present disclosure, a unit pixel is provided. The unit pixel includes a first photoelectric conversion unit converting light received by the first photoelectric conversion unit into a first electric charge and a third electric charge. The first photoelectric conversion unit accumulates the first electric charge and the third electric charge. The unit pixel further includes a first transfer transistor disposed between the first photoelectric conversion unit and a floating diffusion, a second photoelectric conversion unit connected to the floating diffusion and accumulating a second electric charge and a fourth electric charge, a first capacitor connected to the floating diffusion through a first switch transistor, and a second transfer transistor disposed between the second photoelectric conversion unit and the floating diffusion. The first electric charge accumulated in the first photoelectric conversion unit and the second electric charge accumulated in the second photoelectric conversion unit and the first capacitor are reset during a first time interval, the third electric charge is accumulated in the first photoelectric conversion unit during a second time interval subsequent to the first time interval, at least a portion of the third electric charge accumulated in the first photoelectric conversion unit is reset during a third time interval subsequent to the second time interval, and all of the fourth electric charge accumulated in the second photoelectric conversion unit is stored in the first capacitor during a fourth time interval subsequent to the third time interval.

According to some aspects of the present disclosure, an image sensor is provided. The image sensor includes a pixel array including a unit pixel and a read-out circuit. The unit pixel includes a first photoelectric conversion unit converting light received by the first photoelectric conversion unit into a first electric charge. The first photoelectric unit accumulates the first electric charge. The unit pixel further includes a source follower connected to the read-out circuit, a first transfer transistor disposed between the first photoelectric conversion unit and the floating diffusion, and a second photoelectric conversion unit converting light received by the second photoelectric conversion unit into a second electric charge and accumulating the second electric charge. The first photoelectric conversion unit and the second photoelectric conversion unit are connected to the floating diffusion. The unit pixel further includes a first capacitor connected to the floating diffusion through a first switch transistor and a second photoelectric conversion unit and storing the second electric charge. Prior to the first capacitor storing the second electric charge, the unit pixel resets a least a portion of the first electric charge accumulated in the first photoelectric conversion unit in response to the first photoelectric conversion unit receiving a signal including a first voltage level.

BRIEF DESCRIPTION OF THE DRAWINGS

The above and other aspects and features of the present disclosure will become more apparent by describing in detail embodiments thereof with reference to the accompanying drawings, in which.

DETAILED DESCRIPTION

Figure 1:
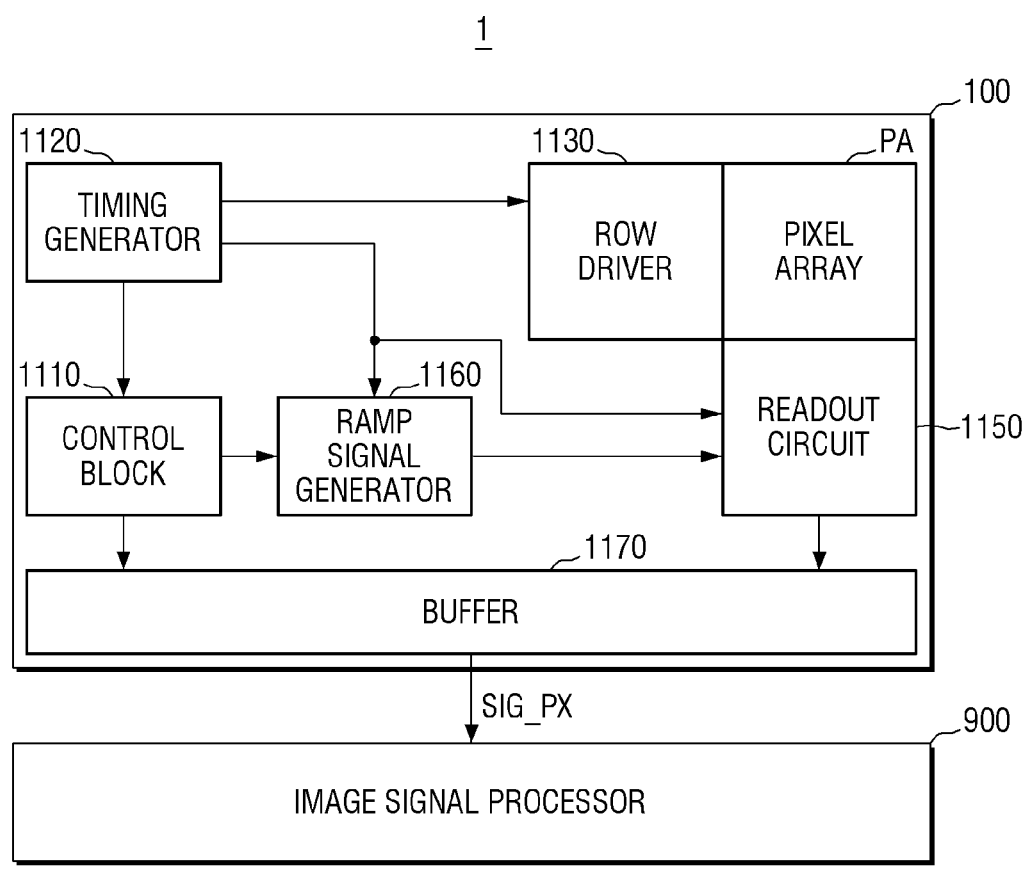
FIG. 1 is a block diagram of an image sensing device according to at least one embodiment.

Embodiments of the inventive concept will be described more fully hereinafter with refence to the accompanying drawings. Like reference numerals may refer to like elements throughout the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer, or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

FIG. 1 is a block diagram of an image sensing device according to at least one embodiment.

Referring to FIG. 1, according to some aspects, an image sensing device 1 includes an image sensor 100 and an image signal processor 900.

According to some aspects, the image sensor 100 generates a pixel signal SIG_PX by sensing an image using light. In an example, the image sensor 100 senses light corresponding to an image and generates the pixel signal SIG_PX in response to sensing the light. In some embodiments, the generated pixel signal SIG_PX is a digital signal. In some embodiments, the generated pixel signal SIG_PX is an analog signal. In some embodiments, the pixel signal SIG_PX includes a specific signal voltage, a reset voltage, or the like.

According to some aspects, the image sensor 100 provides the pixel signal SIG_PX to the image signal processor 900, and the image signal processor 900 processes the pixel signal SIG_PX. In some embodiments, a buffer 1170 of the image sensor 100 outputs the pixel signal SIG_PX, the image signal processor 900 receives the pixel signal SIG_PX from the buffer 1170, and processes or treats the received pixel signal SIG_PX so that the pixel signal SIG_PX is displayed as an image signal.

In some embodiments, the image signal processor 900 performs digital binning on the pixel signal SIG_PX. In some embodiments, the pixel signal SIG_PX is output from the image sensor 100 as a raw image signal from the pixel array PA without analog binning. In some embodiments, the pixel signal SIG_PX is a signal on which analog binning has already been performed before it is received by the image signal processor 900.

Referring to FIG. 1, in some embodiments, the image sensor 100 and the image signal processor 900 are spaced apart from each other in the image sensing device 1. In an example, the image sensor 100 is mounted on a first chip of the image sensing device 1, the image signal processor 900 is mounted on a second chip of the image sensing device 1, and the image sensor 100 and the image signal processor 900 communicate with each other through a predetermined communication interface. In some embodiments, the image sensor 100 and the image signal processor 900 are implemented as a single package in the image sensing device 1, such as an MCP (multi-chip package).

According to some aspects, the image sensor 100 includes a control register block 1110, a timing generator 1120, a row driver 1130, a pixel array PA, a readout circuit 1150, a ramp signal generator 1160, and a buffer 1170.

According to some aspects, the control register block 1110 controls operations of the image sensor 100. In an example, the control register block 1110 directly transmits an operation signal to the timing generator 1120, the ramp signal generator 1160, and the buffer 1170 of the image sensor 100.

According to some aspects, the timing generator 1120 generates a signal that is a reference for timing operations of one or more elements of the image sensor 100. In an example, the timing generator 1120 generates an operation timing reference signal and provides the operation timing reference signal to the row driver 1130, the readout circuit 1150, the ramp signal generator 1160, and various other components or elements of image sensor 100.

According to some aspects, the ramp signal generator 1160 generates and transmits a ramp signal is used by the readout circuit 1150. In some embodiments, the readout circuit 1150 includes a correlated double sampler (CDS), a comparator, or the like, and the ramp signal generator 1160 generates and transmits a ramp signal that is used by the correlated double sampler (CDS), the comparator, or the like.

According to some aspects, the buffer 1170 includes a latch. In some embodiments, the buffer 1170 temporarily stores the pixel signal SIG_PX to be provided outside of the image sensor 100, and transmits the pixel signal SIG_PX to an external memory or an external device outside of the image sensor 100. In some embodiments, the buffer 1170 includes a memory such as a DRAM or a SRAM. In some embodiments, the memory is a memory unit implemented as a hardware circuit.

According to some aspects, the pixel array PA senses external images. In some embodiments, the pixel array PA includes a plurality of pixels. A pixel of the plurality of pixels is referred to as a unit pixel. According to some aspects, the row driver 1130 selectively activates a row of the pixel array PA. According to some aspects, the pixel array PA outputs the pixel signal SIG_PX.

According to some aspects, the readout circuit 1150 samples the pixel signal SIG_PX provided from the pixel array PA, compares the pixel signal SIG_PX to the ramp signal provided by the ramp signal generator 1160, and converts an analog image signal (data) into a digital image signal (data) based on the comparison. In an example, the pixel signal SIG_PX is an analog signal, and the readout circuit 1150 converts the pixel signal SIG_PX to a digital signal based on comparing the pixel signal SIG_PX to the ramp signal.

Figure 2:
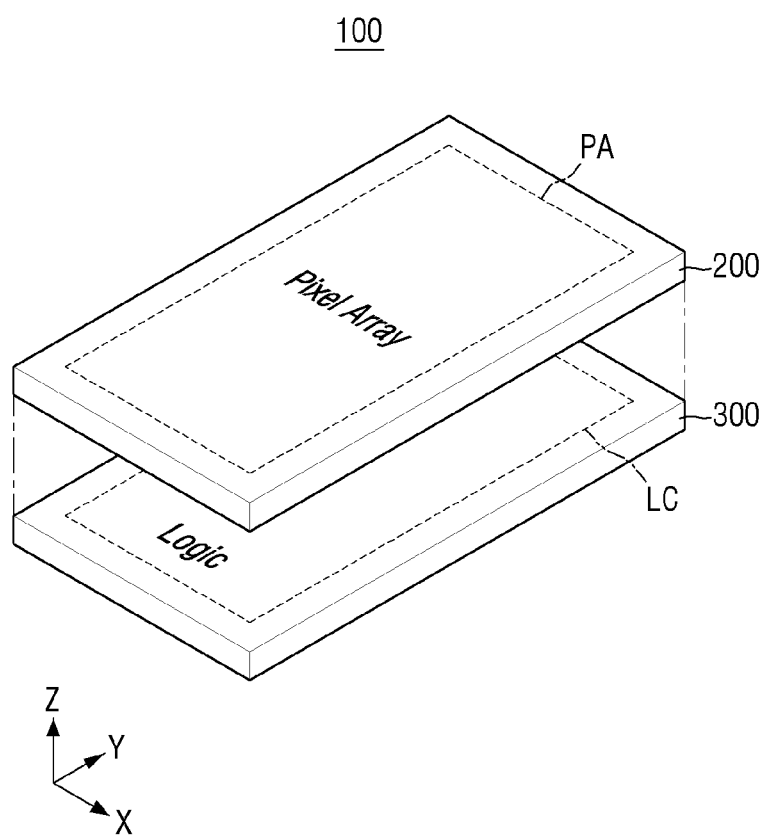
FIG. 2 is a diagram showing a conceptual layout of an image sensor of FIG. 1 according to at least one embodiment.

FIG. 2 is a diagram showing a conceptual layout of the image sensor of FIG. 1 according to at least one embodiment.

Referring to FIG. 2, according to some aspects, the image sensor 100 includes an upper chip 200 stacked on a lower chip 300. In some embodiments, a plurality of pixels are disposed on the upper chip 200 in a two-dimensional array structure. In an example, the upper chip 200 includes a pixel array PA. In some embodiments, the lower chip 300 includes a logic region LC and an analog region including the readout circuit 1140. In some embodiments, the lower chip 300 is placed below the upper chip 200 and is electrically connected to the upper chip 200. In some embodiments, the lower chip 300 receives the pixel signal SIG_PX from the upper chip 200. In some embodiments, the logic region LC receives the pixel signal SIG_PX.

According to some aspects, logic elements are disposed in the logic region LC of the lower chip 300. In some embodiments, the logic elements include circuits for processing a pixel signal SIG_PX received from the pixels of the pixel array PA. In an example, the logic elements include the control register block 1110, the timing generator 1120, the row driver 1130, the readout circuit 1150, the ramp signal generator 1160, and the like as described with reference to FIG. 1.

Figure 3:
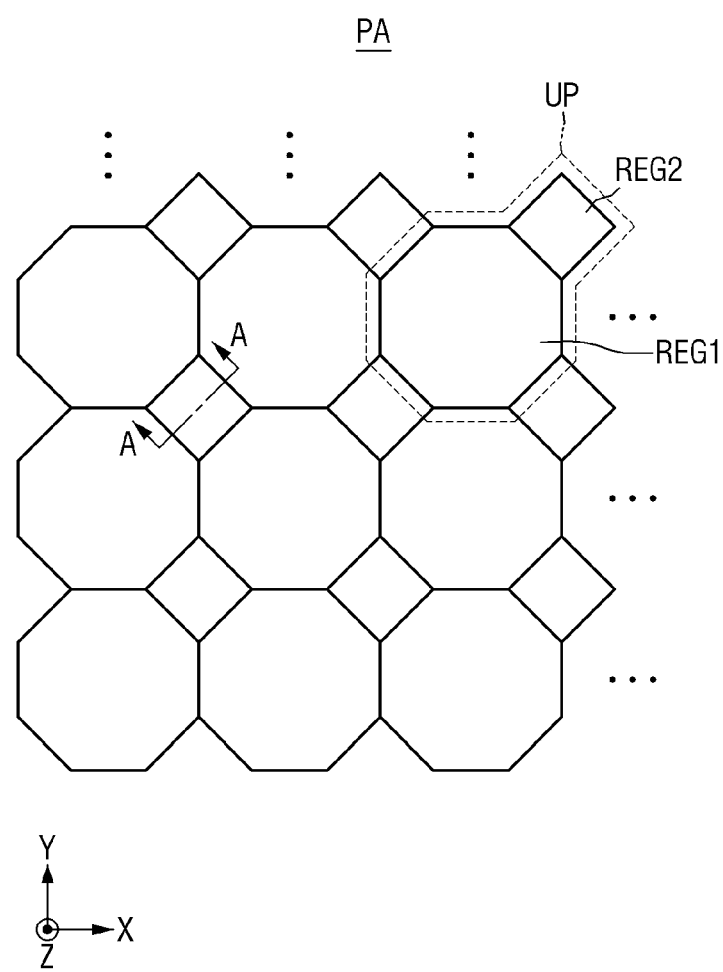
FIG. 3 is a top view of the image sensor of FIG. 1 according to at least one embodiment.

FIG. 3 is a top view of the image sensor of FIG. 1 according to at least one embodiment.

Referring to FIG. 3, according to some aspects, the pixel array PA includes a plurality of unit pixels. In some embodiments, the unit pixels UP of the plurality of unit pixels are regularly arranged in a first direction X and a second direction Y perpendicular to the first direction X. In an example, the unit pixels UP are arranged adjacent to each other as rows extending in the X direction and as columns extending in the Y direction. In some embodiments, a unit pixel UP is one pixel that receives light and outputs an image. A boundary of an example unit pixel UP are indicated in FIG. 3 by the dotted line.

According to some aspects, a unit pixel UP includes a first region REG1 and a second region REG2. In some embodiments, the first region REG1 and the second region REG2 have different shapes from each other when viewed from above in a third direction Z perpendicular to the first direction X and the second direction Y. In some embodiments, the first region REG1 has an octagonal shape and the second region REG2 has a quadrangular shape. In some embodiments, the shapes of the first region REG1 and of the second region REG2 are variously changed.

In some embodiments, the first region REG1 contacts the second region REG2. In some embodiments, an area of the first region REG1 is greater than an area of the second region REG2, and therefore an amount of light incident on the first region REG1 is greater than an amount of light incident on the second region REG2. According to some aspects, the unit pixel UP including the first region REG1 and the second region REG2 generates an electric signal by converting light.

Figure 4:
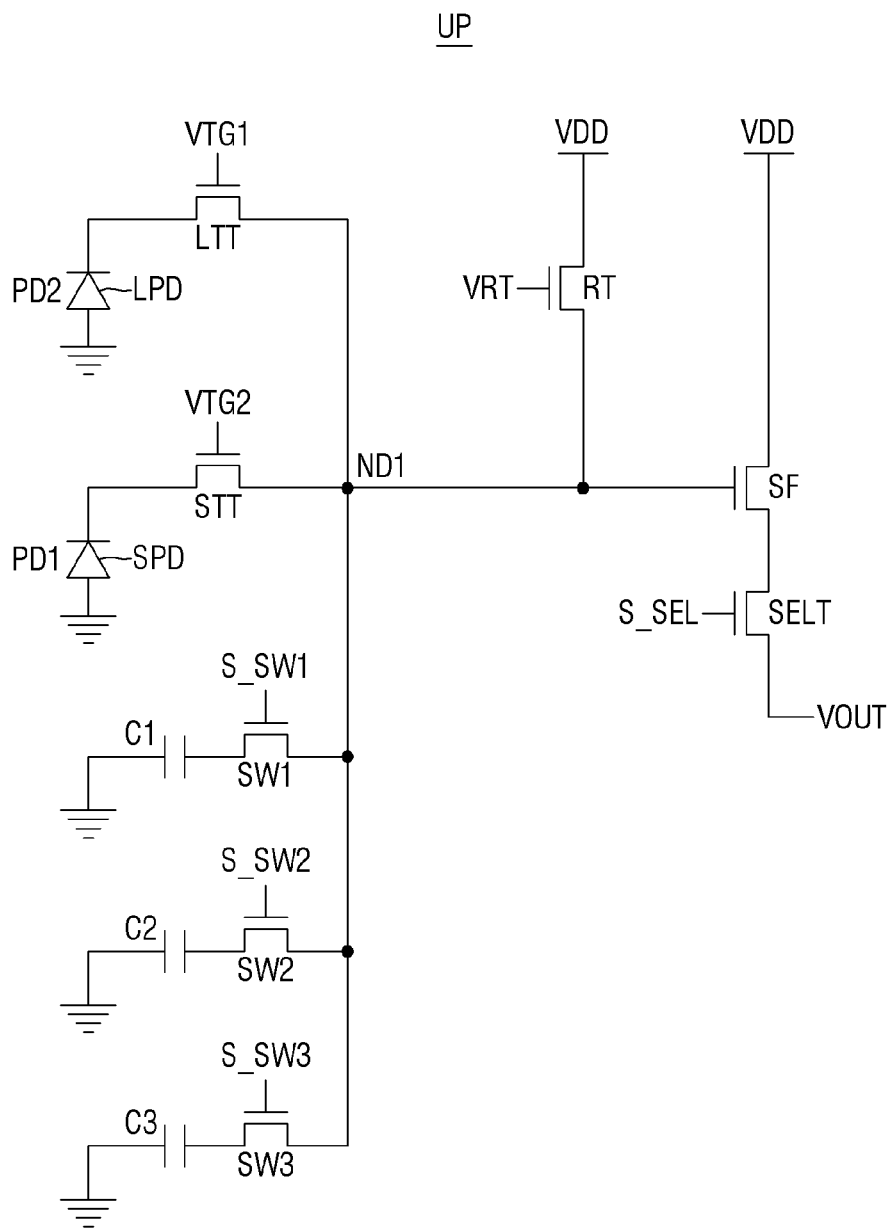
FIG. 4 is a circuit diagram of a unit pixel according to at least one embodiment.

FIG. 4 is a circuit diagram of a unit pixel according to at least one embodiment.

Referring to FIG. 4, according to some aspects, the unit pixel UP includes a large photodiode LPD, a small photodiode SPD, a large transfer transistor LTT, a small transfer transistor STT, a source follower SF, a selection transistor SELT, a reset transistor RT, a first switch SW1, a second switch SW2, a third switch SW3, a first capacitor C1, a second capacitor C2, and a third capacitor C3.

According to some aspects, the large photodiode LPD is implemented as a first photoelectric conversion unit. For example, the large photodiode LPD converts light incident on the first region REG1 into a first electric charge (e.g., the large photodiode LPD generates at least a portion of a unit charge such as a coulomb in response to the first region REG1 receiving incident light, and the large photodiode LPD accumulates or stores portions of unit charges as an electric charge as the portions of unit charges are generated). In some embodiments, the large photodiode LPD is disposed in the first region REG1. In some embodiments, the large photodiode LPD stores (i.e., accumulates) the one or more converted unit charges. In some embodiments, one end of the large photodiode LPD is connected to a ground voltage.

According to some aspects, the large transfer transistor LTT is connected between the large photodiode LPD and a first node ND1. In some embodiments, one end of the large transfer transistor LTT is connected to one end of the large photodiode LPD, and the other end of the large transfer transistor LTT is connected to the first node ND1. According to some aspects, the large transfer transistor LTT is disposed in the first region REG1. In some embodiments, the large transfer transistor LTT is disposed outside of the first region REG1.

According to some aspects, the large transfer transistor LTT includes a large transfer gate LTG. In some embodiments, a large transfer gate signal VTG1 is applied to the large transfer gate LTG to control the large transfer transistor LTT. For example, the large transfer transistor LTT operates in response to the large transfer gate LTG receiving the large transfer gate signal VTG1. In some embodiments, the large transfer gate signal VTG1 includes a variable voltage.

In some embodiments, when the large transfer gate signal VTG1 includes a first voltage level, the large transfer transistor LTT is turned on and the first electric charge generated by the large photodiode LPD is transferred to the first node ND1. In an example, the large transfer transistor LTT turns on in response to the large transfer gate LTG receiving the large transfer gate signal VTG1 including the first voltage level, and all of the first electric charge accumulated in the large photodiode LPD is therefore transferred to the first node ND1. In some embodiments, the first node ND1 is therefore implemented as a floating diffusion of the unit pixel UP. In some embodiments, when the large transfer gate signal VTG1 is applied to the large transfer gate LTG of the large transfer transistor LTT including the first voltage level, all of the first electric charge accumulated in the large photodiode LPD is reset as described with reference to FIG. 5.

According to some aspects, the small photodiode SPD is implemented as a second photoelectric conversion unit. For example, the small photodiode SPD converts light incident on the second region REG2 into a second electric charge (e.g., the small photodiode SPD generates one or more third unit charges in response to the second region REG2 receiving incident light). In some embodiments, the small photodiode SPD is disposed in the second region REG2. In some embodiments, the small photodiode SPD stores (e.g., accumulates) the converted second electric charge. In some embodiments, one end of the small photodiode SPD is connected to the first node ND1. In some embodiments, one end of the small photodiode SPD is connected to the ground voltage.

According to some aspects, after all of the second electric charge accumulated in the small photodiode SPD is reset as described with reference to FIG. 5, the small photodiode generates and accumulates a fourth electric charge.

According to some aspects, the large transfer transistor LTT turns off in response to receiving a large transfer gate signal VTG1 including a second voltage level. According to some aspects, after the first electric charge is reset, the large photodiode LPD generates and accumulates a third electric charge. According to some aspects, the large transfer transistor LTT turns on in response to receiving a large transfer gate signal VTG1 including a third voltage level, and at least a portion of the third electric charge accumulated in the large photodiode LPD is therefore transferred to the first node ND1.

According to some aspects, a gate of the source follower SF is connected to the first node ND1. In some embodiments, the gate of the source follower SF receives an electric charge from the first node ND1 (e.g., the floating diffusion). In some embodiments, the source follower SF is connected to one end of the power supply voltage VDD and to one end of the selection transistor SELT. In some embodiments, the source follower SF operates based on the electric charge applied to the first node ND1 by the large photodiode LPD.

According to some aspects, the selection transistor SELT is connected to the source follower SF and the output voltage VOUT. In some embodiments, a selection signal S_SEL is applied to the gate of the selection transistor SELT to control the selection transistor SELT. In an example, the selection transistor SELT operates in response to a gate of the selection transistor SELT receiving the selection signal S_SEL. In some embodiments, the selection transistor SELT operates only while the unit pixel UP is operating.

According to some aspects, the reset transistor RT is disposed between the first node ND1 and the power supply voltage VDD. In some embodiments, the reset transistor RT includes a reset gate RG. In some embodiments, a reset gate signal VRT is applied to the reset transistor RT. For example, the reset gate RG receives the reset gate signal VRT. According to some aspects, when the reset gate signal VRT is pulled up, the reset transistor RT connects the first node ND1 to the power supply voltage VDD to reset the unit pixel UP. For example, the reset gate RG pulls up the reset gate signal VRT, thereby turning the reset transistor RT on. When the reset transistor RT turns on, the reset transistor RT connects the first node ND1 to the power supply voltage VDD, thereby resetting the unit pixel UP.

According to some aspects, the small transfer transistor STT is connected between the first node ND1 and the small photodiode SPD. In some embodiments, the small transfer transistor STT includes a small transfer gate STG. In some embodiments, a small transfer gate signal VTG2 is applied to the small transfer gate STG to control the small transfer transistor STT. In an example, the small transfer transistor STT operates in response to the small transfer gate STG receiving the small transfer gate signal VTG2.

In some embodiments, when the small transfer gate signal VTG2 is pulled up (for example, to a higher voltage level), the small transfer transistor STT turns on, and at least portions of electric charges generated by the small photodiode SPD are transferred to the first node ND1. For example, the small transfer gate STG pulls up the small transfer gate signal VTG2, thereby turning the small transfer transistor STT on. When the small transfer transistor STT turns on, the small transfer transistor connects the small photodiode SPD to the first node ND1, and the small photodiode SPD therefore provides at least a portion of an electric charge to the first node ND1. According to some embodiments, the small transfer transistor STT is disposed in the second region REG2. In some embodiments, the small transfer transistor STT is disposed outside of the second region REG2.

According to some aspects, a first capacitor C1 is connected between a first switch SW1 and the power supply voltage VDD. In some embodiments, the first capacitor C1 receives an electric charge accumulated in the small photodiode SPD. In at least one embodiment, the first capacitor C1 stores the electric charge accumulated in the small photodiode SPD. In this case, the first capacitor C1 is not disposed in the second region REG2. In some embodiments, the first capacitor C1 is disposed on the lower chip 300 described with reference to FIG. 2.

According to some aspects, the first switch SW1 is disposed between the first node ND1 and the first capacitor C1. In some embodiments, a first switch signal S_SW1 is applied to the gate of the first switch SW1 to connect the first capacitor C1 and the first node ND1. In an example, the first switch SW1 turns on in response to the gate of the first switch SW1 receiving the first switch signal S_SW1, thereby connecting the first capacitor C1 to the first node ND1.

According to some aspects, a second capacitor C2 is connected between a second switch SW2 and the power supply voltage VDD. In some embodiments, the second capacitor C2 receive an electric charge accumulated in the small photodiode SPD. In some embodiments, the second capacitor C2 stores the electric charge accumulated in the small photodiode SPD.

According to some aspects, the second switch SW2 is disposed between the first node ND1 and the second capacitor C2. In some embodiments, a second switch signal S_SW2 is applied to the gate of the second switch SW2 to connect the second capacitor C2 and the first node ND1. In an example, the second switch SW2 turns on in response to the gate of the second switch SW2 receiving the second switch signal S_SW2, thereby connecting the second capacitor C2 to the first node ND1.

According to some aspects, a third capacitor C3 is connected between a third switch SW3 and the power supply voltage VDD. In some embodiments, the third capacitor C3 receives an electric charge accumulated in the small photodiode SPD. In some embodiments, the third capacitor C3 store electric charge accumulated in the small photodiode SPD.

According to some aspects, the third switch SW3 is disposed between the first node ND1 and the third capacitor C3. In some embodiments, a third switch signal S_SW3 is applied to the gate of the third switch SW3 to connect the third capacitor C3 and the first node ND1. In an example, the third switch SW3 turns on in response to the gate of the third switch SW3 receiving the third switch signal S_SW3, thereby connecting the third capacitor C3 to the first node ND1.

FIG. 4 shows that the unit pixel UP includes the first capacitor C1, the second capacitor C2, and the third capacitor C3. However, in some embodiments, the number of capacitors included in the unit pixel UP are variously changeable. In an example, the number of capacitors included in the unit pixel UP depends on a dynamic range of the pixel signal that is output from the unit pixel UP.

In a comparative example, when an electric charge is stored in the first capacitor C1, the second capacitor C2, and the third capacitor C3, at least a portion of electric charge stored (e.g., accumulated) in the large photodiode LPD may overflow, causing a signal interference. Therefore, according to some aspects, before electric charges accumulated in the small photodiode SPD are stored in the first capacitor C1, the second capacitor C2, and the third capacitor C3, at least a portion of the third electric charge accumulated in the large photodiode LPD is reset to avoid the overflow. In some embodiments, when the large transfer gate signal VTG1 including the third voltage level is applied to the large transfer gate LTG of the large transfer transistor LTT, at least a portion of the third electric charge accumulated in the large photodiode LPD is reset as described with reference to FIG. 5.

According to some aspects, the third voltage level is a voltage level between the first voltage level associated with turning on the large transfer transistor LTT and transferring each of the one or more electric charges generated by the large photodiode LPD to the first node ND1 and the second voltage level associated with turning off the large transfer transistor LTT. For example, the third voltage level is higher than the second voltage level and lower than the first voltage level. In an example, the first voltage level and the third voltage level are positive voltage levels, and the second voltage level is a negative voltage level.

Figure 5:
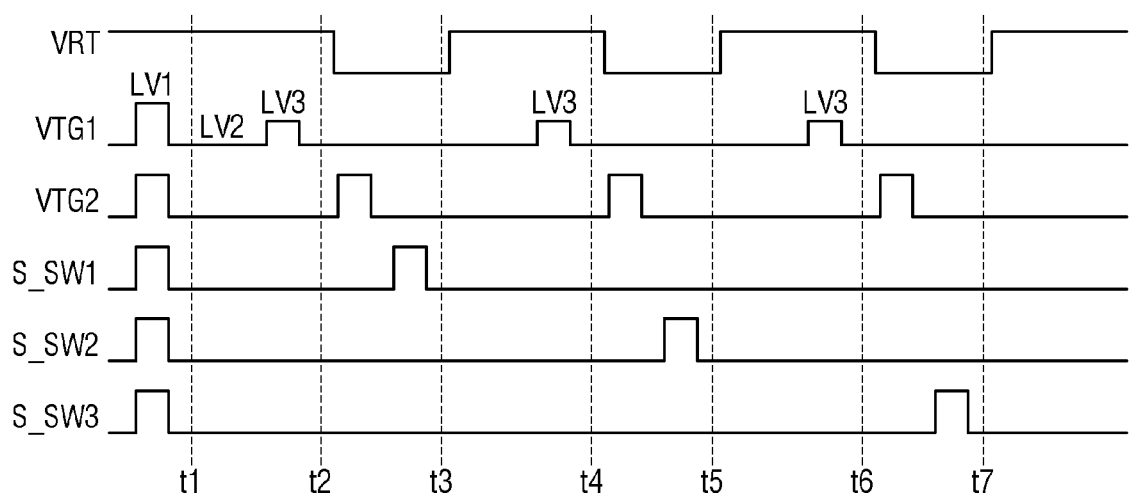
FIG. 5 is a timing diagram for explaining a method for operating the unit pixel according to at least one embodiment.

FIG. 5 is a timing diagram for explaining a method for operating the unit pixel according to at least one embodiment. FIGS. 6 to 10 are diagrams for explaining the operation of the unit pixel according to at least one embodiment.

Figure 6:
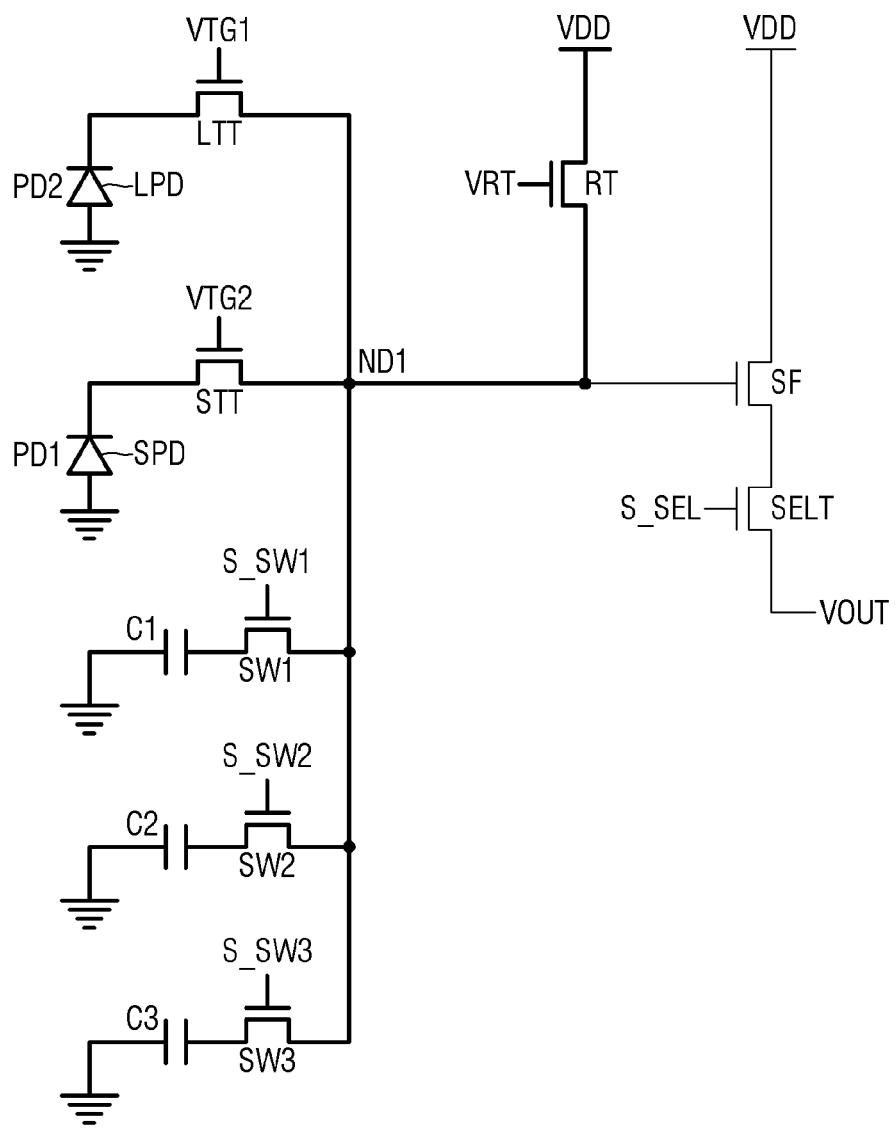
FIGS. 6 to 10 are diagrams for explaining the operation of the unit pixel according to at least one embodiment.

Referring to FIGS. 5 and 6, according to some aspects, the unit pixel UP performs a whole reset operation at a first time point t1.

According to some aspects, during a time interval prior to the first time point t1, the reset gate signal VRT, the large transfer gate signal VTG1, the small transfer gate signal VTG2, and the first switch signal to the third switch signal S_SW1 to S_SW3 are pulled up and then pulled down. During the first time interval, the large transfer gate signal VTG1 is pulled up to a first voltage level LV1, such that the large transfer gate signal VTG1 includes the first voltage level LV1. Therefore, at the first time point t1, all of the first electric charge accumulated or stored in the large photodiode LPD, all of the second electric charge accumulated or stored in the small photodiode SPD, and electric charges stored in the first capacitor C1, the second capacitor C2, and to the third capacitor C3 is reset. According to some aspects, the large photodiode LPD converts and accumulates a third electric charge after the first electric charge is reset. According to some aspects, the small photodiode LPD converts and accumulates a fourth electric charge after the second electric charge is reset.

In at least one embodiment, at first time point t1, the source follower SF converts an electric charge accumulated in the first node ND1 into a reset voltage, and the selection signal S_SEL is pulled up in response to the reset signal.

According to some aspects, an electric charge accumulated in the large photodiode LPD is read out by the source follower SF prior to the first time point t1. In an example, the first electric charge accumulated in the large photodiode LPD is read out through a sampling operation before the whole reset operation is performed.

Figure 7:
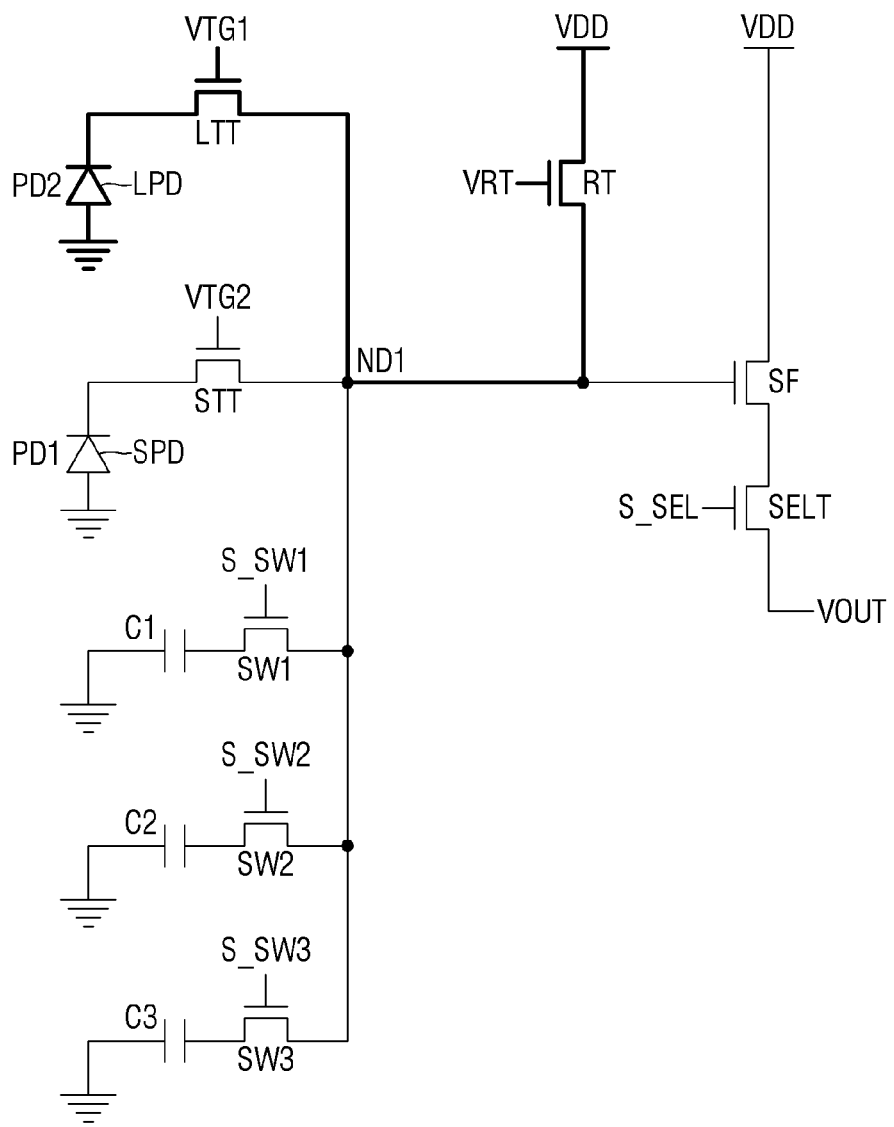

Referring to FIGS. 5 and 7, according to some aspects, the unit pixel UP resets at least a portion of the third electric charge accumulated in the large photodiode LPD at a second time point t2.

According to some aspects, during a time interval prior to the second time point t2, the small transfer gate signal VTG2 and the first switch signal to the third switch signal S_SW1 to S_SW3 remain pulled down. In some embodiments, during the second time interval, each of the small transfer gate signal VTG2, the first switch signal S_SW1, the second switch signal S_SW2, and the third switch signal S_SW3 receive the signal including the second voltage level LV2, and therefore, the small transfer transistor STT is off and the first capacitor C1, the second capacitor C2, and the third capacitor C3 are not connected to the small photodiode SPD.

According to some aspects, during the time interval prior to the second time point t2, the large transfer gate signal VTG1 is pulled down, then pulled up, and then pulled down again. In some embodiments, when the large transfer gate signal VTG1 is pulled up, the large transfer transistor LTT turns on, and the large transfer transistor LTT connects the large photodiode LPD and the first node ND1. In some embodiments, the large transfer gate signal VTG1 is pulled up during a time interval between the first time point t1 and the second time point t2, and the signal applied to the large transfer transistor LTT (e.g., the large transfer gate signal VTG1) includes the signal of the third voltage level LV3.

In some embodiments, the third voltage level LV3 is between the first voltage level LV1 and the second voltage level LV2. In an example, the third voltage level LV3 is lower than the first voltage level LV1 and higher than the second voltage level LV2. In some embodiments, the second voltage level LV2 is lower than the first voltage level LV1 and the third voltage level LV3. In some embodiments, the second voltage level LV2 is a negative level. In some embodiments, each of the first voltage level LV1 and the third voltage level LV3 is a positive voltage level.

According to some aspects, the reset gate signal VRT remains pulled up at the second time point t2. Thus, the reset transistor RT is on, and the reset transistor RT therefore connects the first node ND1 to the power supply voltage VDD.

Accordingly, as the large photodiode LPD, the first node ND1, and the power supply voltage VDD are connected, at least a portion of the third electric charge accumulated in the large photodiode LPD is reset. In contrast to the whole reset operation described with reference to FIGS. 5 and 6, in which the large transfer gate signal VTG1 including the first voltage level LV1 is applied to the large transfer transistor LTT to reset all of the first electric charge accumulated in the large photodiode LPD, the large transfer gate signal VTG1 including the third voltage level LV3 different from the first voltage level LV1 is applied to the large transfer transistor LTT, and therefore all of the third electric charge accumulated in the large photodiode LPD might not reset, but at least a portion of the third electric charge is reset. According to some aspects, the large photodiode LPD converts and accumulates a fifth electric charge after the third electric charge is reset.

Figure 8:
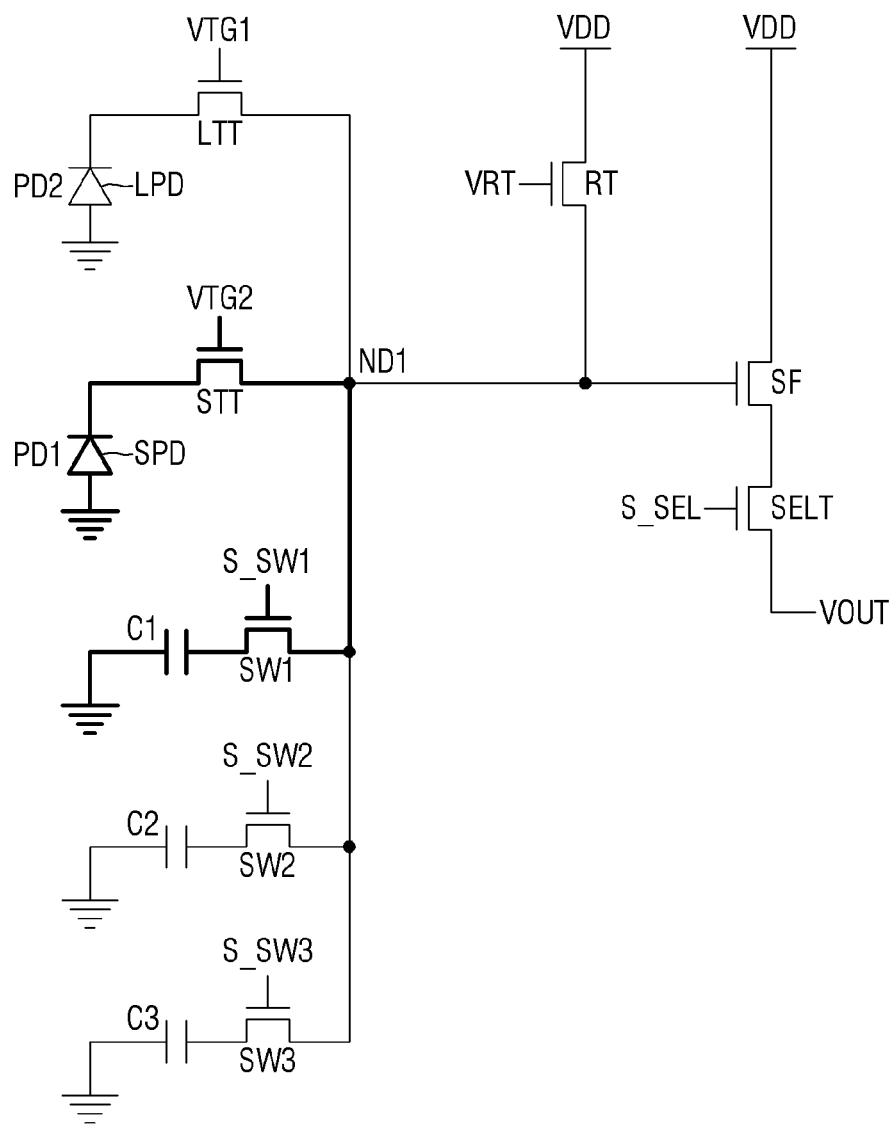

Referring to FIGS. 5 and 8, according to some aspects, the unit pixel UP stores a fourth electric charge accumulated in the small photodiode SPD in the first capacitor C1 at the third time point t3.

In some embodiments, during a time interval prior to the third time point t3, the reset gate signal VRT is pulled down, the small transfer gate signal VTG2 is pulled up and then pulled down again, and then the first switch signal S_SW1 is pulled up and then pulled down again. According to some aspects, when the small transfer gate signal VTG2 is pulled up, the small transfer transistor STT turns on, and the small transfer transistor STT therefore connects the small photodiode SPD and the first node ND1, such that the fourth electric charge accumulated in the small photodiode SPD is transferred to the first node ND1.

In some embodiments, the small transfer gate signal VTG2 is pulled down and the first switch signal S_SW1 is pulled up such that the first switch SW1 turns on, and the first switch SW1 therefore connects the first capacitor C1 and the first node ND1, such that the fourth electric charge accumulated in the small photodiode SPD is stored in the first capacitor C1 after being received from the first node ND1. According to some aspects, the first capacitor C1 increases the capacitance of the first node ND1 and thus increases a full well capacity of the unit pixel UP. According to some aspects, the small photodiode SPD converts and accumulates a sixth electric charge after the fourth electric charge is provided to the first node ND1.

Referring to FIG. 5, according to some aspects, the unit pixel UP resets at least some of the fifth electric charge accumulated in the large photodiode LPD at a fourth time point t4. In some embodiments, the operation of resetting the at least some of the fifth electric charge accumulated in the large photodiode LPD at the fourth time point t4 is substantially the same as resetting at least some of the third electric charge accumulated in the large photodiode LPD at the second time point t2, and a description of the similar operation is therefore omitted for the sake of brevity. According to some aspects, the large photodiode LPD converts and accumulates a seventh electric charge after the fifth electric charge is reset.

According to some aspects, prior to the fourth time point t4, as the large transfer gate signal VTG1 is maintained at the second voltage level LV2 before the large transfer gate signal VTG1 is pulled up to the third voltage level LV3, the large photodiode LPD is not connected to the first node ND1, and the large photodiode LPD therefore stores the fifth electric charge converted from light received by the large photodiode LPD.

According to some aspects, during the time interval prior to the fourth time point t4, the reset gate signal VRT is pulled up, and the large transfer gate signal VTG1 is pulled up to the third voltage level LV3 and pulled down again. Therefore, at the fourth time point t4, all of the fifth electric charge accumulated in the large photodiode LPD might not reset, but at least a portion of the fifth electric charge resets in response to the large transfer gate signal VTG1 of the third level voltage LV3.

Figure 9:
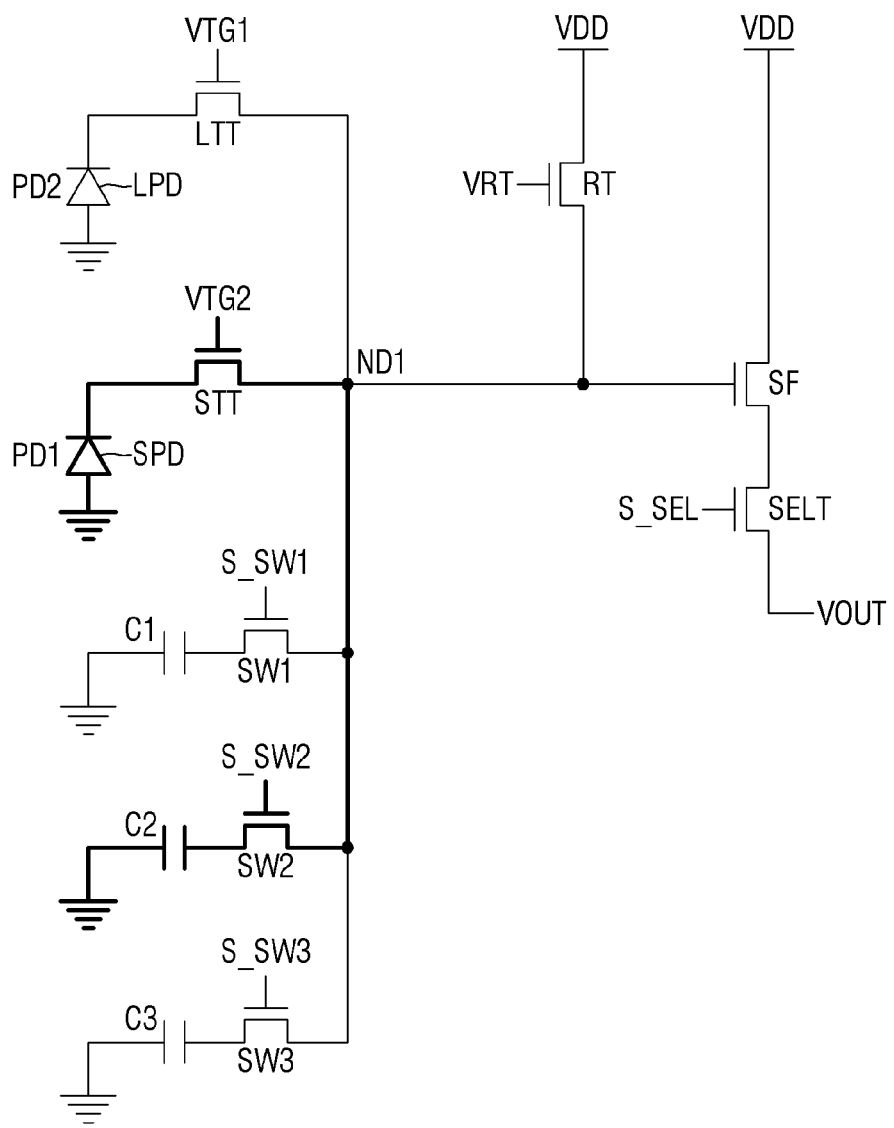

Referring to FIGS. 5 and 9, according to some aspects, the unit pixel UP stores a sixth electric charges accumulated in the small photodiode SPD in the second capacitor C2 at the fifth time point t5.

In some embodiments, during the time interval prior to the fifth time point t5 (e.g., during a time between the fourth time point t4 and the fifth time point t5), the small transfer gate signal VTG2 is pulled up and then pulled down again, and then the first switch signal S_SW1 is pulled up and then pulled down again. When the small transfer gate signal VTG2 is pulled up, the small transfer transistor STT turns on, and the small transfer transistor STT therefore connects the small photodiode SPD and the first node ND1, such that the sixth electric charge accumulated in the small photodiode SPD is transferred to the first node ND1.

In some embodiments, when the small transfer gate signal VTG2 is pulled down and the first switch signal S_SW1 is pulled up such that the first switch SW1 turns on, the first switch SW1 therefore connects the first capacitor C1 and the first node ND1 such that the sixth electric charge accumulated in the small photodiode SPD is stored in the second capacitor C2 after the sixth electric charge is provided by the first node ND1. According to some aspects, the small photodiode SPD converts and accumulates an eighth electric charge after the sixth electric charge is provided to the first node ND1.

Figure 10:
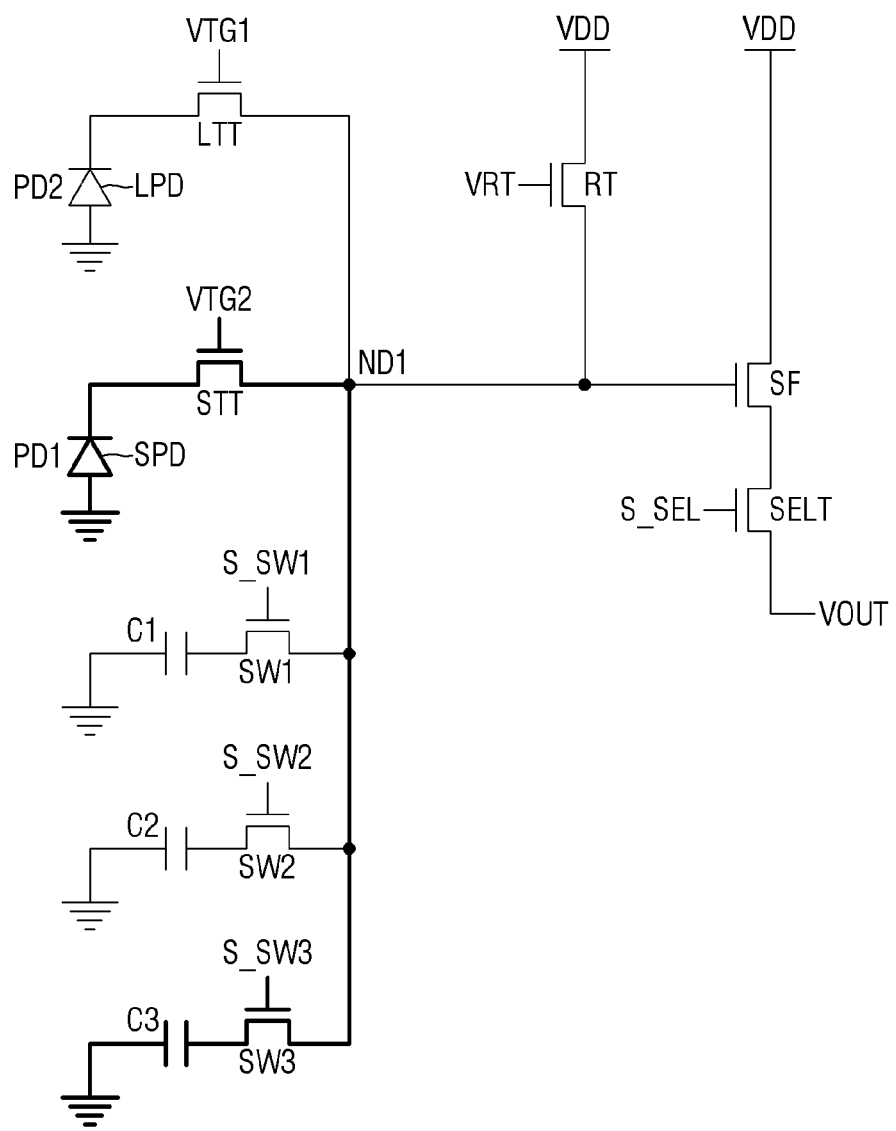

Referring to FIGS. 5 and 10, according to some aspects, at least a portion of the seventh electric charge accumulated in the large photodiode LPD is reset at a sixth time point t6, and the eighth electric charge accumulated in the small photodiode SPD is stored in the third capacitor C3. According to some aspects, the large photodiode LPD continues to convert and accumulate subsequent electric charges that are reset wholly or in part according to voltage levels included in the large transfer gate signal VTG1, and the small photodiode continues to convert and accumulate subsequent electric charges that are reset or are provided to the first node ND1 according to voltage levels included in the small transfer gate signal VTG2.

According to some aspects, as an electric charge accumulated in the large photodiode LPD is partially reset by the large transfer gate signal VTG1 including the third voltage level LV3, when an electric charge accumulated in the small photodiode SPD is subsequently stored in a capacitor, it is possible to mitigate signal interference caused by an overflow of the electric charge accumulated in the large photodiode LPD.

According to some aspects, by storing electric charges accumulated in the small photodiode SPD in the first capacitor C1, the second capacitor C2, and the third capacitor C3, the unit pixel UP outputs a signal with a wide dynamic range and a low amount of noise.

According to some aspects, the large photodiode LPD is used for image sensing in a low-illuminance environment. In an example, the large photodiode LPD includes a large area. Therefore, an electric charge accumulated in the large photodiode LPD corresponds to a first illuminance range. According to some aspects, the small photodiode SPD is used for image sensing in a high-illuminance environment. In an example, the small photodiode SPD includes a small area. Therefore, an electric charge accumulated in the small photodiode SPD corresponds to a second illuminance range. According to some aspects, one or more of the first capacitor C1, the second capacitor C2, and the third capacitor C3 expands the dynamic range of the unit pixel UP.

Figure 11:
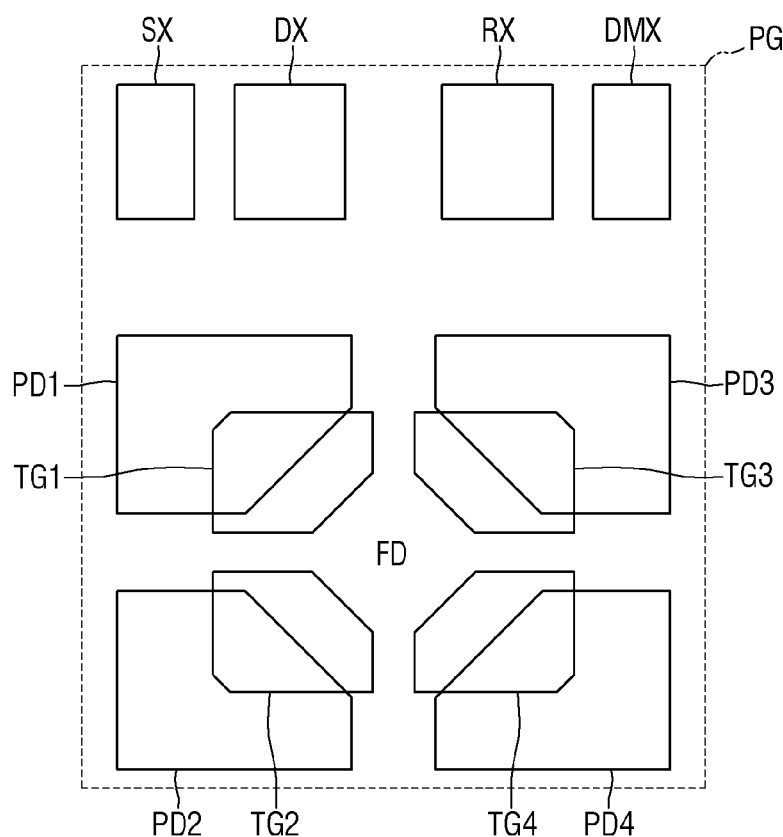
FIG. 11 is a top view showing a pixel group including the unit pixel according to at least one embodiment.

FIG. 11 is a top view showing a pixel group including a unit pixel according to at least one embodiment.

Referring to FIG. 11, according to some aspects, a pixel group PG includes first to fourth unit pixels respectively including first to fourth photodiodes PD1 to PD4 and first to fourth transfer gate electrodes TG1 to TG4. According to some aspects, the pixel group PG also includes a selection transistor SX, a drive transistor DX, a reset transistor RX, and a dummy transistor DMX, where each of the first to fourth unit pixels is connected to the selection transistor SX, the drive transistor DX, the reset transistor RX, and the dummy transistor DMX, such that the selection transistor SX, the drive transistor DX, the reset transistor RX, and the dummy transistor DMX are implemented as the respective elements included in a unit pixel described with reference to FIG. 3. In at least one embodiment, the first to fourth photodiodes PD1 to PD4 are connected to the floating diffusion region FD. In an example, the floating diffusion region FD includes four first nodes ND1 described with reference to FIG. 4, where the four first nodes ND1 respectively correspond to the first to fourth unit pixels. In this case, each of the first to fourth photodiodes PD1 to PD4 includes a small photodiode (such as small photodiode SPD described with reference to FIG. 4) and a large photodiode (such as large photodiode LPD described with reference to FIG. 4).

According to some aspects, the first transfer gate electrode TG1 is implemented as a gate electrode of the first transfer transistor connected to the first photodiode PD1, the second transfer gate electrode TG2 is implemented as a gate electrode of the second transfer transistor connected to the second photodiode PD2, the third transfer gate electrode TG3 is implemented as a gate electrode of the third transfer transistor connected to the third photodiode PD3, and the fourth transfer gate electrode TG4 is implemented as a gate electrode of the first transfer transistor connected to the fourth photodiode PD4.

According to some aspects, the dummy transistor DMX separates nodes included in the floating diffusion region FD (such as first nodes ND1 described with reference to FIG. 1) from an electric charge output node of an adjacent pixel group PG. in some embodiments, the dummy transistor DMX is omitted, and an element isolation film such as an STI (shallow trench isolation) film separates the nodes included in the floating diffusion region FD from the electric charge output node of the adjacent pixel group PG. In some embodiments, the dummy transistor DMX is omitted, and a PN junction separates the nodes included in the floating diffusion region FD from the electric charge output node of the adjacent pixel group PG. In an example, a node of the floating diffusion region FD is an n-type, and an active region of an electric charge output node of the adjacent pixel group PG is also an n-type. Therefore, the node of the floating diffusion region FD and the electric charge output node of the adjacent pixel group PG is separated by ion-implanting p-type impurities between the node of the floating diffusion region FD and the electric charge output node of the adjacent pixel group.

Although four photodiodes and four transfer gate electrodes are spaced apart in FIG. 11, according to some aspects, at least two photodiodes are connected as a single photodiode, and at least two transfer gate electrodes are connected as a single transfer gate electrode. When the at least two transfer gate electrodes are connected as the single transfer gate electrode, the number of contacts connected to the single transfer gate electrode is reduced.

Figure 12:
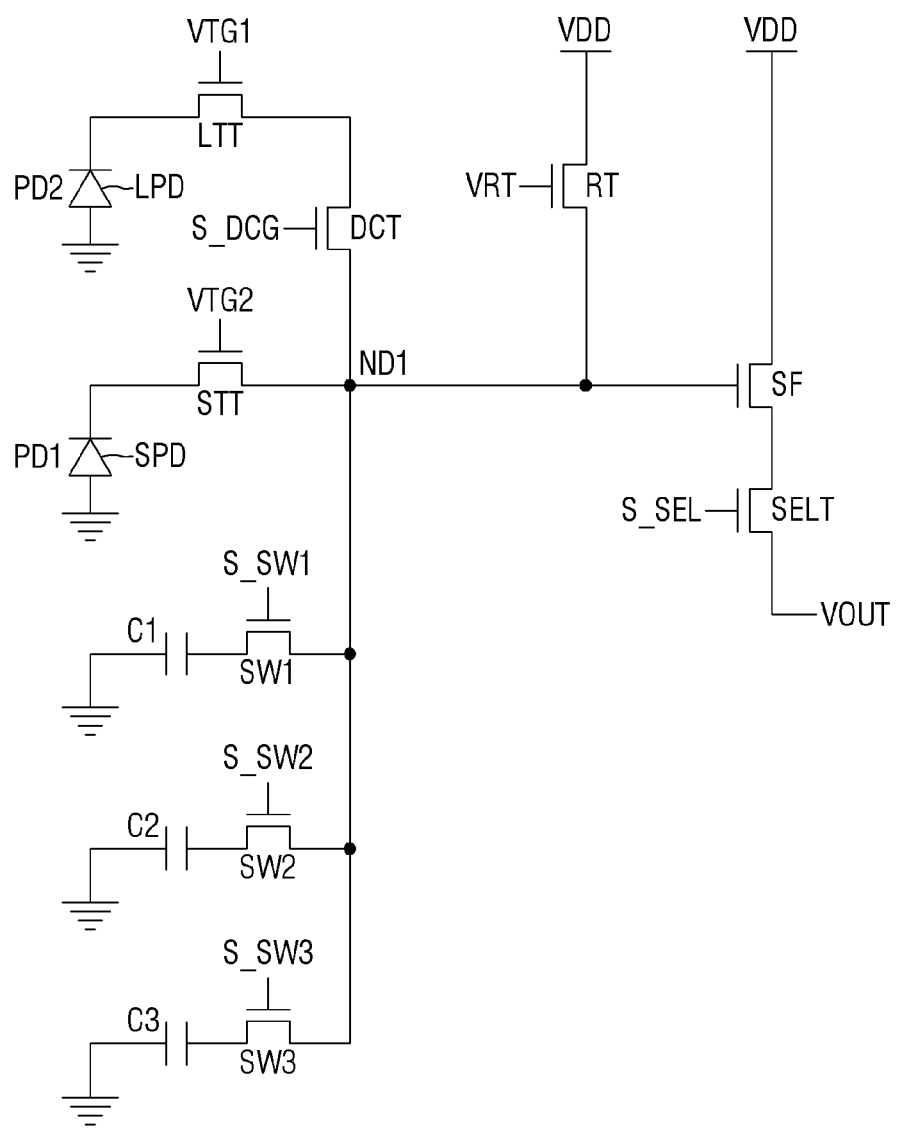
FIG. 12 is a circuit diagram of a unit pixel according to at least one embodiment.

FIG. 12 is a circuit diagram of a unit pixel according to at least one embodiment. For convenience of explanation, a description of similar elements described with reference to FIG. 4 is omitted.

Referring to FIG. 12, according to some aspects, the unit pixel UP further includes a dual conversion transistor DCT between the first node ND1 and the small transfer transistor STT. In some embodiments, the unit pixel UP controls the dynamic range of the image to be sensed by changing the conversion gain through the dual conversion transistor DCT.

Figure 13:
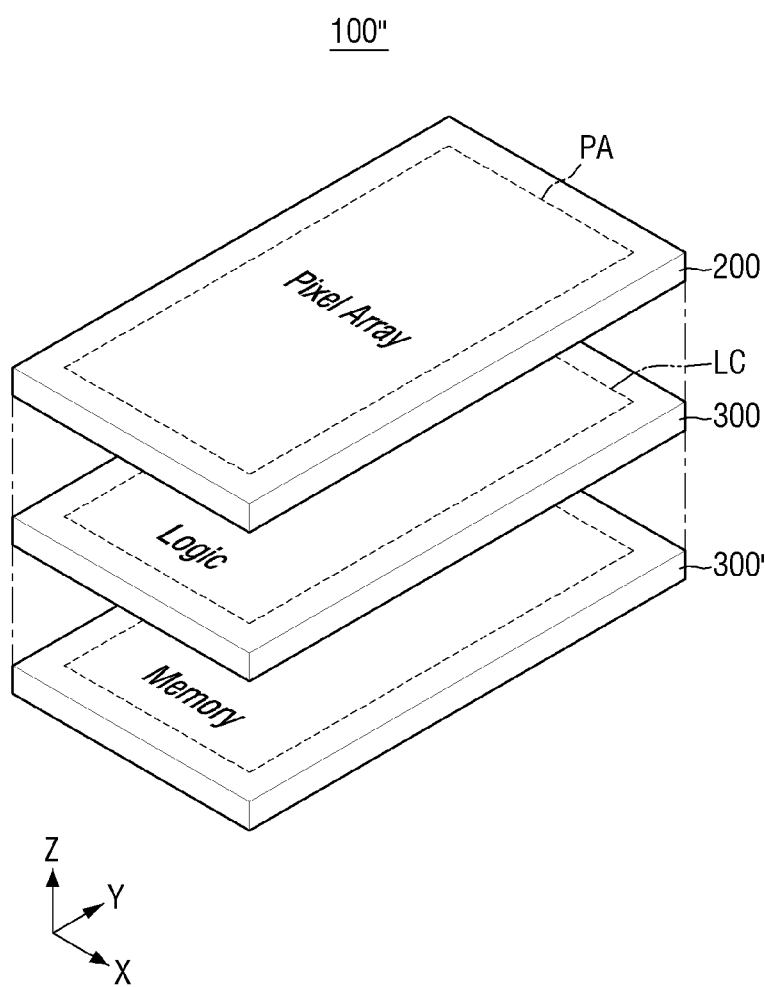
FIG. 13 is a diagram showing a conceptual layout of an image sensor according to at least one embodiment.

FIG. 13 is a diagram showing a conceptual layout of the image sensor according to at least one embodiment.

Referring to FIG. 13, according to some aspects, an image sensor 100" includes an upper chip 200, a lower chip 300, and a memory chip 300'. In some embodiments, the upper chip 200, the lower chip 300, and the memory chip 300' are sequentially stacked in the third direction Z. In some embodiments, the memory chip 300' is placed below the lower chip 300. In some embodiments, the memory chip 300' includes a memory device. In an example, the memory chip 300' includes a volatile memory device such as a DRAM or a SRAM. In some embodiments, the memory chip 300' receives signals from the upper chip 200 and the lower chip 300 and processes the signals using the memory device. Therefore, in some embodiments, the image sensor 100" including the memory chip 300' corresponds to a three-stack image sensor.

Figure 14:
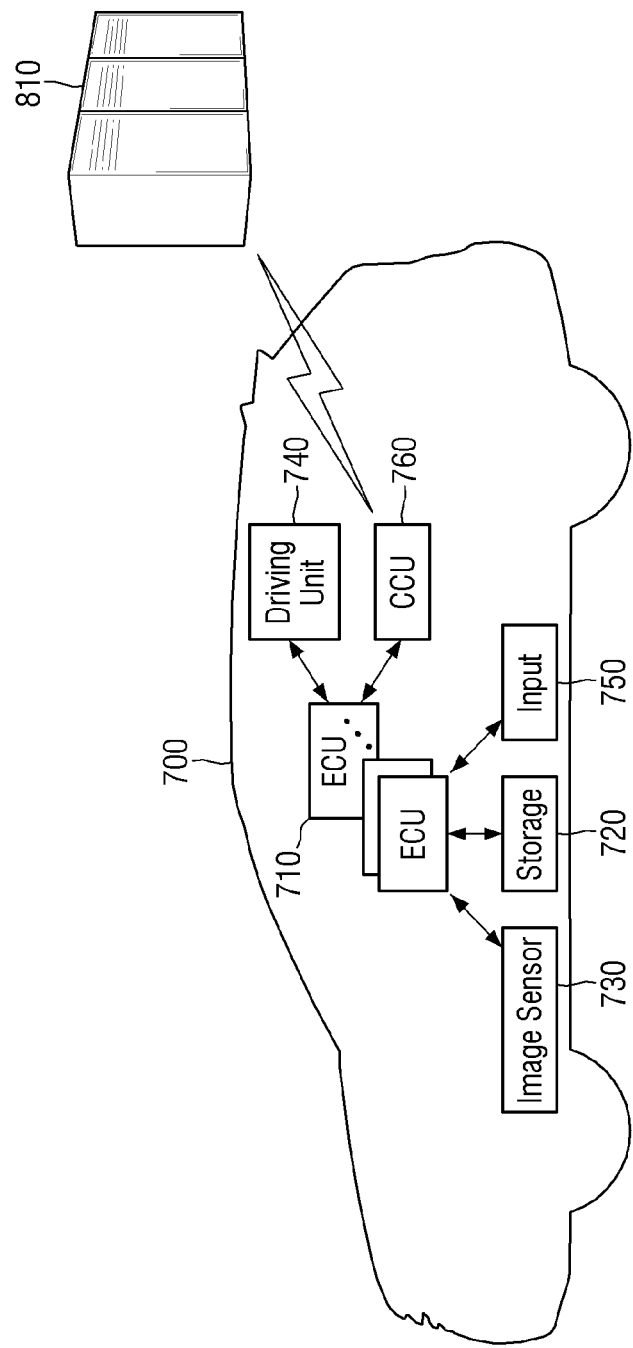
FIG. 14 is a diagram of a vehicle including an image sensor according to at least one embodiment.

FIG. 14 is a diagram of a vehicle including an image sensor according to at least one embodiment. For convenience of explanation, a description of similar elements described with reference to FIGS. 1 to 13 are omitted or are briefly described.

Referring to FIG. 14, according to some aspects, a vehicle 700 includes a plurality of electronic control units (ECU) 710 and a storage device 720.

In some embodiments, each electronic control device of the plurality of electronic control devices 710 is electrically, mechanically, and communicatively connected to at least one of the plurality of devices provided in the vehicle 700 and controls the operation of at least one device of the plurality of devices based on at least one function execution command.

In some embodiments, the plurality of devices includes an image sensor 730 that acquires information required to perform at least one function, and a driving unit 740 that performs at least one function. In an example, the image sensor 730 includes the image sensor 100 described with reference to FIGS. 1 to 12. In an example, the image sensor 730 corresponds to the image sensor 100 including the unit pixel UP. In this case, the image sensor 730 is implemented as an automotive image sensor.

According to some aspects, the driving unit 740 includes a fan and compressor of an air conditioner, a fan of a ventilation device, an engine and a motor of a power device, a motor of a steering device, a motor and a valve of a brake device, an opening/closing device of a door or a tailgate, and the like.

According to some aspects, the plurality of electronic control devices 710 communicate with the image sensor 730 and the driving unit 740 using, for example, at least one of an Ethernet, a low voltage differential signaling (LVDS) communication, and a LIN (Local Interconnect Network) communication.

According to some aspects, the plurality of electronic control devices 710 determine whether there is a need to perform a function based on information acquired through the image sensor 730, and when is the plurality of electronic control devices 710 determine that there is a need to perform the function, the plurality of electronic control devices 710 control the operation of the driving unit 740 that performs the function and control an amount of the operation based on the acquired information. In some embodiments, the plurality of electronic control devices 710 stores the acquired information in the storage device 720 or reads and uses the information stored in the storage device 720.

According to some aspects, the plurality of electronic control devices 710 controls the operation of the driving unit 740 that performs the function based on the function execution command that is input through the input unit 750, checks the setting amount corresponding to the information that is input through the input unit 750, and controls the operation of the driving unit 740 that performs the function based on the checked setting amount.

According to some aspects, each of the plurality of electronic control devices 710 controls any one function independently, or controls any one function in cooperation with other electronic control devices. In an example, when a distance to an obstacle detected through a distance detection unit is within a reference distance, an electronic control device of a collision prevention device outputs a warning sound for a collision with the obstacle through a speaker.

According to some aspects, an electronic control device of an autonomous driving control device receives navigation information, road image information, and distance information relating to obstacles in cooperation with the electronic control device of the vehicle terminal, the electronic control device of the image acquisition unit, and the electronic control device of the collision prevention device, and controls the power device, the brake device, and the steering device using the received information, thereby performing autonomous driving.

According to some aspects, a connectivity control unit (CCU) 760 is electrically, mechanically, and communicatively connected to each of the plurality of electronic control devices 710, and communicates with each of the plurality of electronic control devices 710. In an example, the connectivity control unit 760 directly communicates with a plurality of electronic control devices 710 provided inside the vehicle, communicates with an external server, and communicates with an external terminal through an interface. According to some aspects, the connectivity control unit 760 communicates with the plurality of electronic control devices 710, and communicates with the server 810 using an antenna and an RF communication.

In at least one embodiment, the connectivity control unit 760 communicates with the server 810 by wireless communication. In this case, the wireless communication between the connectivity control unit 760 and the server 810 is performed using various wireless communication techniques and/or devices, such as a GSM (global System for Mobile Communication), a CDMA (Code Division Multiple Access), a WCDMA (Wideband Code Division Multiple Access), a UMTS (universal mobile telecommunications system), a TDMA (Time Division Multiple Access), and an LTE (Long Term Evolution), in addition to a Wifi module and a Wireless broadband module.

While the inventive concept has been particularly shown and described with reference to embodiments thereof, it will be understood that various changes in form and details may be made therein without departing from the spirit and scope of the present disclosure.

What is claimed is:

1. A unit pixel comprising:
    a first photoelectric conversion unit converting light received by the first photoelectric conversion unit into first electric charges;
    a first transfer transistor disposed between the first photoelectric conversion unit and a first node;
    a first capacitor connected to the first node through a first switch transistor;
    a second photoelectric conversion unit connected to the first node; and
    a second transfer transistor disposed between the second photoelectric conversion unit and the first node,
    wherein a signal including a first voltage level is applied to the first transfer transistor and the second transfer transistor during a first time interval,
    a signal including a second voltage level is applied to the first transfer transistor, the second transfer transistor, and the first switch transistor during a second time interval subsequent to the first time interval,
    a signal including a third voltage level different from the first voltage level and the second voltage level is applied to the first transfer transistor during a third time interval subsequent to the second time interval,
    the signal including the first voltage level is applied to the second transfer transistor and the first switch transistor during a fourth time interval subsequent to the third time interval, and
    the first photoelectric conversion unit is larger than the second photoelectric conversion unit.

2. The unit pixel of claim 1, wherein the first photoelectric conversion unit accumulates the first electric charges,
    the second photoelectric conversion unit accumulates second electric charges,
    the first electric charges accumulated in the first photoelectric conversion unit corresponds to a first illuminance range, and
    the second electric charges accumulated in the second photoelectric conversion unit corresponds to a second illuminance range higher than the first illuminance range.

3. The unit pixel of claim 1, wherein the first photoelectric conversion unit accumulates the first electric charges, and
    at least a portion of the first electric charges accumulated in the first photoelectric conversion unit is reset during the third time interval.

4. The unit pixel of claim 1, wherein the second photoelectric conversion unit accumulates second electric charges, and
    all of the second electric charges accumulated in the second photoelectric conversion unit is stored in the first capacitor during the fourth time interval.

5. The unit pixel of claim 1, wherein the third voltage level is lower than the first voltage level.

6. The unit pixel of claim 5, wherein the third voltage level is higher than the second voltage level.

7. The unit pixel of claim 1, wherein the first node is a common floating diffusion of the first photoelectric conversion unit and the second photoelectric conversion unit, which is connect to the first transfer transistor and the second transfer transistor.

8. The unit pixel of claim 1, further comprising:
    a second capacitor connected to the first node through a second switch transistor; and
    a third capacitor connected to the first node through a third switch transistor.

9. The unit pixel of claim 8, wherein the second photoelectric conversion unit accumulates second electric charges, third electric charges, and fourth electric charges, and
    the first capacitor stores the second electric charges, the second capacitor stores the third electric charges, and the third capacitor stores the fourth electric charges accumulated in the second photoelectric conversion unit.

10. The unit pixel of claim 1, wherein the first photoelectric conversion unit accumulates the first electric charges, and the first electric charges accumulated in the first photoelectric conversion unit is read out into a pixel signal through a sampling operation prior to the first time interval.

11. A unit pixel comprising:
a first photoelectric conversion unit converting received light into first electric charges and third electric charges, wherein the first photoelectric conversion unit accumulates the first electric charges and the third electric charges;
a first transfer transistor disposed between the first photoelectric conversion unit and a floating diffusion;
a second photoelectric conversion unit connected to the floating diffusion and accumulating second electric charges and fourth electric charges;
a first capacitor connected to the floating diffusion through a first switch transistor and accumulating the second electric charges; and
a second transfer transistor disposed between the second photoelectric conversion unit and the floating diffusion,
wherein the first electric charges accumulated in the first photoelectric conversion unit and the second electric charges accumulated in the second photoelectric conversion unit and the first capacitor are reset during a first time interval,
the third electric charges is accumulated in the first photoelectric conversion unit during a second time interval subsequent to the first time interval,
at least a portion of the third electric charges accumulated in the first photoelectric conversion unit is reset during a third time interval subsequent to the second time interval,
all of the fourth electric charges accumulated in the second photoelectric conversion unit is stored in the first capacitor during a fourth time interval subsequent to the third time interval, and
the first photoelectric conversion unit is larger than the second photoelectric conversion unit.

12. The unit pixel of claim 11, wherein a signal including a first voltage level is applied to the first transfer transistor and the second transfer transistor during the first time interval,
a signal including a second voltage level is applied to the first transfer transistor, the second transfer transistor, and the first switch transistor during the second time interval,
a signal including a third voltage level different from the first voltage level and the second voltage level is applied between the first time interval and the second time interval, and
the signal including the first voltage level is applied to the second transfer transistor and the first switch transistor during the third time interval.

13. The unit pixel of claim 12, wherein the third voltage level is higher than the second voltage level and lower than the first voltage level.

14. The unit pixel of claim 11, wherein the first electric charges accumulated in the first photoelectric conversion unit is read out into a pixel signal through a sampling operation prior to the first time interval.

15. The unit pixel of claim 11, wherein a voltage level of the signal applied to the first transfer transistor during the first time interval is different from a voltage level of the signal applied to the first transfer transistor during the third time interval.

16. An image sensor comprising:
a pixel array including a unit pixel; and
a read-out circuit,
wherein the unit pixel includes:
a first photoelectric conversion unit converting light received by the first photoelectric conversion unit into first electric charges, wherein the first photoelectric conversion unit accumulates the first electric charges;
a source follower connected to the read-out circuit;
a first transfer transistor disposed between the first photoelectric conversion unit and the floating diffusion;
a second photoelectric conversion unit converting light received by the second photoelectric conversion unit into second electric charges and accumulating the second electric charges, wherein the first photoelectric conversion unit and the second photoelectric conversion unit are connected to the floating diffusion; and
a first capacitor connected to the floating diffusion through a first switch transistor and storing the second electric charges,
wherein, prior to the first capacitor storing the second electric charges, the unit pixel resets at least a portion of the first electric charges accumulated in the first photoelectric conversion unit in response to the first transfer transistor receiving a signal including a first voltage level, and
the first photoelectric conversion unit is larger than the second photoelectric conversion unit.

17. The image sensor of claim 16, wherein a signal including a second voltage level is applied to the first transfer transistor to reset all of the first electric charges accumulated in the first photoelectric conversion unit, and
the second voltage level is different from the first voltage level.

18. The image sensor of claim 17, wherein the first voltage level is lower than the second voltage level.

19. The image sensor of claim 16, wherein the first photoelectric conversion unit converts the light received by the first photoelectric conversion unit into electric charges corresponding to a first illuminance range, and
the second photoelectric conversion unit converts the light received by the second photoelectric conversion unit into electric charges corresponding to a second illuminance range higher than the first illuminance range.

20. The image sensor of claim 16, wherein the unit pixel further includes:
a second capacitor connected to the floating diffusion; and
a third capacitor connected to the floating diffusion,
wherein each of the second capacitor and the third capacitor store electric charges accumulated in the second photoelectric conversion unit.

* * * * *